United States Patent
Nakamura

(10) Patent No.: US 7,538,558 B2
(45) Date of Patent: May 26, 2009

(54) FAILURE DETECTION APPARATUS AND FAILURE DETECTION METHOD FOR A SEMICONDUCTOR APPARATUS

(75) Inventor: Hisashi Nakamura, Kanagawa (JP)

(73) Assignee: NEC Electronics Corporation, Kawasaki, Kanagawa (JP)

(*) Notice: Subject to any disclaimer, the term of this patent is extended or adjusted under 35 U.S.C. 154(b) by 243 days.

(21) Appl. No.: 11/727,136

(22) Filed: Mar. 23, 2007

(65) Prior Publication Data

US 2007/0245194 A1  Oct. 18, 2007

(30) Foreign Application Priority Data

Mar. 24, 2006  (JP) .............................. 2006-082518

(51) Int. Cl.
  *G01R 31/08*  (2006.01)
  *G01R 31/28*  (2006.01)

(52) U.S. Cl. .................. 324/522; 324/76.82; 714/731

(58) Field of Classification Search ................. 324/522, 324/76.11, 76.82, 765, 158.1; 714/727, 731
See application file for complete search history.

(56) References Cited

U.S. PATENT DOCUMENTS 5,621,740 A * 4/1997 Kamada ..................... 714/727

FOREIGN PATENT DOCUMENTS

JP  5-264676  10/1993

* cited by examiner

*Primary Examiner*—Vincent Q Nguyen
(74) *Attorney, Agent, or Firm*—McGinn IP Law Group, PLLC

(57) ABSTRACT

A failure detection apparatus for a semiconductor apparatus includes a clock line to transmit a clock signal, a shield line to shield the clock line, an inverted signal setting unit to supply signals inverted to each other to the clock and shield lines in a failure detection mode, and a failure detection evaluator to detect a failure by comparing static current consumption in each of the failure detection mode and a normal operation mode.

14 Claims, 5 Drawing Sheets

FAILURE DETECTION APPARATUS AND FAILURE DETECTION METHOD FOR A SEMICONDUCTOR APPARATUS

BACKGROUND OF THE INVENTION

1. Field of the Invention

The present invention relates to a failure detection apparatus and a failure detection method for a semiconductor apparatus, and particularly to a failure detection apparatus and a failure detection method for a semiconductor apparatus having a clock and a shield lines.

2. Description of Related Art

As a manufacturing failure of a semiconductor apparatus having IC (Integrated Circuit) and LSI (Large Scale Integration) or the like, a bridge failure due to a short-out between adjacent lines is known. To detect such bridge failure, signals of each adjacent line must be set to inverted values (logical level 0 and 1). Accordingly it is often difficult to detect a failure in general, and thus a method for detecting a bridge failure more efficiently is desired.

A scan test, one of the failure detection methods, is purposed to detect a stack failure in a F/F (flip-flop) and is also able to detect a bridge failure in a CLK (clock) line. However for a F/F not caught in the failure detection, or a CLK line adjacent to a macro not tested, a bridge failure cannot be detected.

For such sections in which a failure therein cannot be detected, conventionally a user pattern is provided to a semiconductor apparatus to detect a failure. However in recent years, there are occasions in which a user pattern cannot be prepared for detecting a failure, and there are increasing number of semiconductor apparatuses that cannot remove manufacturing failure without user patterns provided thereto. Accordingly it is necessary to detect a bridge failure by a different method other than a scan test or a user pattern.

For example a conventional failure detection method for detecting a bridge failure is disclosed in Japanese Unexamined Patent Application Publication No. HEI 5-264676. The flowchart of FIG. 5 illustrates the conventional failure detection method disclosed in Japanese Unexamined Patent Application Publication No. HEI 5-264676.

As shown in FIG. 5, in the conventional failure detection method, a combination of lines between devices which possibly have bridge failures is extracted from a layout pattern of a semiconductor apparatus (S901). Next, a logical pattern is obtained, where the logical pattern makes the extracted line pattern to be logical values 0 and 1 (S902). Then, the obtained logical pattern is input to the semiconductor apparatus to measure static current consumption flowing from a power supply (S903). After that, the measured static current consumption value is compared with a static current consumption value in a normal time that is obtained previously (S904). If the measured static current consumption is found to be larger than the normal time as result of the comparison, a generation of a bridge failure is detected.

However in the conventional failure detection method, a combination of lines connecting each devices is extracted as adjacent lines from a layout pattern, and there was no consideration over a bridge failure between a CLK and a shield lines. Accordingly in the conventional failure detection method, it has now been discovered that a bridge failure between a CLK and shield lines cannot be found for portions where a scan test cannot be used to detect a failure.

SUMMARY OF THE INVENTION

According to an aspect of the present invention, there is provided a failure detection apparatus for a semiconductor apparatus that includes a clock line to transmit a clock signal, a shield line to shield the clock line, an inverted signal setting unit to supply signals inverted to each other to the clock and shield lines in a failure detection mode, and a failure detection evaluator to detect a failure by comparing static current consumption in each of the failure detection mode and a normal operation mode.

As the failure detection apparatus supplies an inverted signal to the clock and shield lines to measure static current consumption, a bridge failure in the clock line can be accurately detected.

According to another aspect of the present invention, there is provided a method for failure detection for a semiconductor apparatus that includes supplying signals inverted to each other to a clock line that passes a clock signal and a shield line that shields the clock line in a failure detection mode, and detecting a failure by comparing static current consumptions in each of the failure detection and a normal operation modes.

The failure detection method enables to accurately detect a bridge failure in a clock line because the static current consumption is measured by supplying inverted signals (signals inverted to each other) to the clock and shield lines.

A preferred embodiment of the present invention provides a failure detection apparatus and a failure detection method for a semiconductor apparatus that are able to accurately detect a bridge failure in a clock line.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

A failure detection method for a semiconductor apparatus according to an embodiment of the present invention is described hereinafter in detail. In this embodiment, by inputting an inverted logical value 0/1 (0 or 1) to a CLK and a shield lines, a bridge failure of the CLK and bridge lines can be detected.

Figure 1:
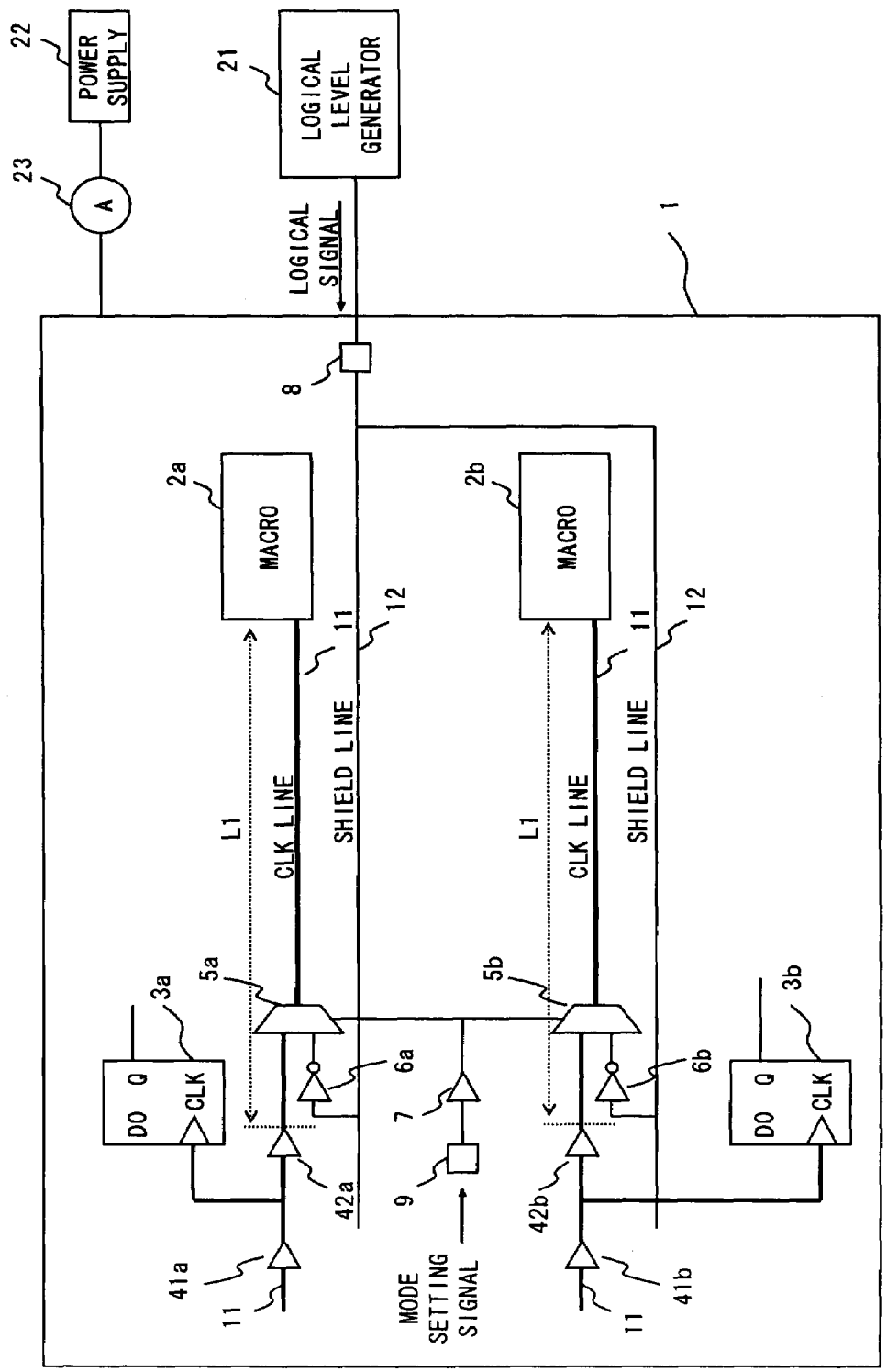
FIG. 1 is a configuration diagram showing a failure detection apparatus for a semiconductor apparatus according to the present invention.

A configuration of the failure detection apparatus in the semiconductor apparatus is described hereinafter in detail with reference to FIG. 1. As shown in FIG. 1 the failure detection apparatus includes a semiconductor apparatus 1, an object to be tested, a logical level generator 21 for generating a logical value 0/1, a power supply 22 for operating the semiconductor device 1, and a power supply current measuring device 23 for measuring static current consumption that flows through the semiconductor apparatus 1 from the power supply 22. The logical level generator 21 is connected to an input/output pad 8 of the semiconductor apparatus 1. The power supply 22 is connected to a power supply terminal (not shown) of the semiconductor apparatus 1 via the power supply current measuring device 23. The power supply current measuring device 23 is a failure detection evaluator that detects a failure by comparing static current consumption in each of a failure detection and a normal operation mode.

A plurality of macros 2a and 2b having predetermined features including RAM (Random Access Memory) are formed to the semiconductor apparatus 1. CLK lines (clock lines) 11 are connected to the macros 2a and 2b, and CLK signals (clock signals) are supplied thereto.

The CLK lines 11 are lines for passing the CLK signals to the macros 2a and 2b from a CLK signal generation circuit (not shown). A plurality of buffers 41a, 41b, 42a, and 42b are connected to the CLK lines 11 so as to prevent clock skews.

Further, F/Fs 3a and 3b that operate according to the CLK signals are connected to the CLK lines 11. For example the F/Fs 3a and 3b are scan F/Fs for scan tests that are able to perform scan tests by a scan chain that connects a plurality of F/Fs 3a and 3b.

In FIG. 1, the macros 2a and 2b that are connected to an end of the CLK line 11 are not tested by scan tests. The F/Fs 3a and 3b are last F/Fs that are connected closest to the macros 2a and 2b in the CLK lines 11. Buffers 42a and 42b are disposed immediately after the F/Fs 3a and 3b (closest to the macros 2a and 2b) in the CLK lines 11. In the CLK lines 11, the portions from the buffers 42a and 42b to the macros 2a and 2b is macro dedicated portions L1.

Further, shield lines 12 are provided along the CLK lines 11. The shield lines 12 are formed side by side with the CLK lines so as to reduce noise and signal delays generated due to a parasitic capacity of the adjacent CLK lines. In FIG. 1, the shield lines 12 are provided to only one side of the CLK line 11. However it is not limited to this but the shield lines 12 may be provided to both sides of the CLK lines 11. The shield lines 12 for each of the CLK lines 11 are commonly connected to the input/output pad (external terminal) 8. The logical level generator 21 probes the input/output pad 8 so as to input the logical value 0/1 (reference signal) from the input/output pad 8. Inverters 6a and 6b for generating an inverted value is connected to the shield lines 12, where the inverted value is an inverted logical value 0/1. The inverters 6a and 6b are inverted signal setting units for supplying signals inverted to each other to the CLK lines 11 and shield lines 12 in the failure detection mode.

Multiplexers 5a and 5b are connected between the inverters 6a and 6b, and the buffers 42a and 42b. Especially, the multiplexers 5a and 5b are provided in the macro dedicated portions L1. Specifically, the multiplexers 5a and 5b are provided closer to the macros 2a and 2b than the F/Fs 3a and 3b that are closest to the macros 2a and 2b. The multiplexers 5a and 5b are signal selectors for selecting either a CLK signal that is output from the buffers 42a and 42b or a signal of the inverted value that is output from the inverters 6a and 6b, and supplying the selected signal to the macros 2a and 2b.

The multiplexers 5a and 5b switch a signal to select depending on a mode setting signal (switching signal). The mode setting signal is commonly input to each of the multiplexers 5a and 5b from a mode setting terminal 9, an external terminal, via a buffer 7. The modes to be set here are a normal operation mode for normal operations, and a failure detection mode for measuring static current consumption to detect a bridge failure. In the normal operation mode, the multiplexers 5a and 5b select and output the CLK signal from the buffers 42a and 42b. In the failure detection mode, the multiplexers 5a and 5b select the inverted value from the inverters 6a and 6b.

Accordingly in the failure detection mode, inverted values (conflicting data) are always input to the shield line 12 and the CLK line 11, a bridge failure can be detected by using static current consumption at this time.

Figure 2:
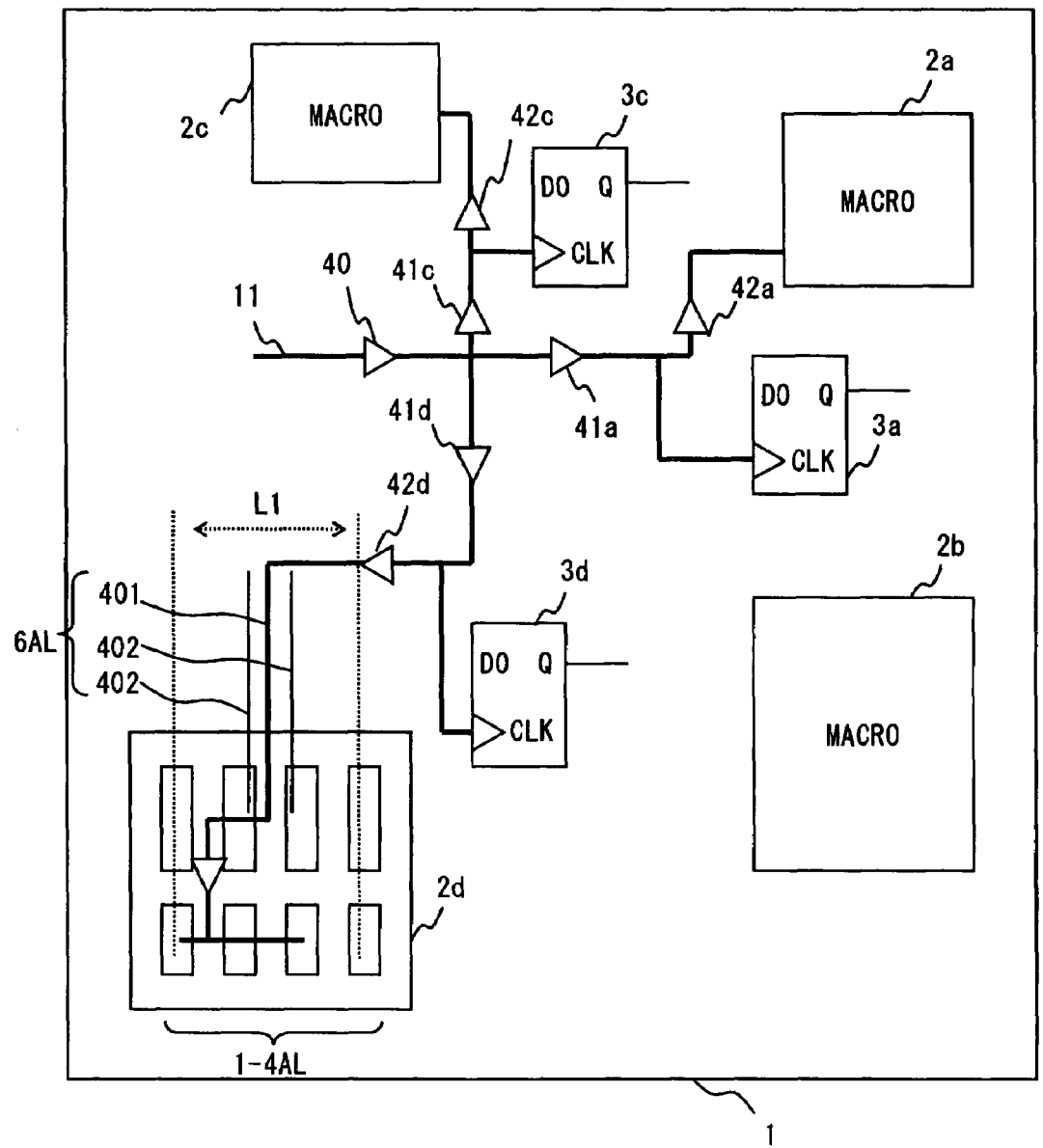
FIG. 2 is a configuration diagram showing a failure detection apparatus for a semiconductor apparatus according to the present invention.

FIG. 2 is a configuration example showing the semiconductor apparatus 1 having macros 2a to 2d. The CLK signals are supplied to each of the macros 2a to 2d via the buffers 40, 41a to 41d, and 42a to 42d. As with FIG. 1, the F/Fs 3a to 3d are the last F/F of the CLK lines. The buffers 42a to 42d are buffers immediately after the last F/Fs. From the buffers 42a to 42d to the macros 2a to 2d is the macro dedicated portions L1. The macros 2a to 2d are not tested by scan tests. A bridge failure in the CLK lines 11 up to the last F/Fs can be detected by scan tests, however a bridge failure in the macro dedicated portions L1 in the CLK lines 11 cannot be detected by scan tests. When the CLK lines 11 in the macro dedicated portions L1 is wired solely (isolated) and are long lines, a bridge failure is likely to be occurred.

The macros 2a to 2d such as a RAM include 1 to 4 ALs (a first to a fourth wiring layer ). The CLK lines include 5 to 7 ALs (a fifth to a seventh layer). If a signal line is wired adjacent to the CLK lines 11, there may be influences from a cross talk. Thus the shield lines must be provided adjacent to the CLK lines 11 so as to reduce influences from a cross talk or the like. Especially in the vicinity of the macros 2a to 2d, it is necessary to wire in the layer not used by the macros 2a to 2d. Therefore portion to wire the CLK lines 11 and signal lines are limited, and the CLK lines 11 are possibly wired adjacent to the signal line, thus the shield lines are necessary. For example for the macro 2d, in the macro dedicated portion L1 of the CLK line 11, a CLK line 401 and a shield line 402 are formed in a 6 AL (a sixth wiring layer), and if the CLK line 401 is a long line, the possibility of a short-out between the CLK line 401 and shield line 402. Note that in an example of FIG. 2, the shield line 402 is provided to both sides of the CLK line 401. However as with FIG. 1, the shield line 402 may be provided to only one side of the CLK line 401.

Furthermore, the more the number of macros as with the macros 2a to 2d of FIG. 2, the more the number of the macro dedicated portions L1 that supply CLKs only to the macros 2a to 2d, and thus there are more sections not detected in the long lines, thereby the possibility of short-out failure increases.

Accordingly in this embodiment, a bridge failure in the CLK lines 11 are effectively detected by disposing the multiplexers 5a and 5b of FIG. 1 in the macro dedicated portion L1 that supplies CLKs to only the macros 2a to 2d.

Figure 3:
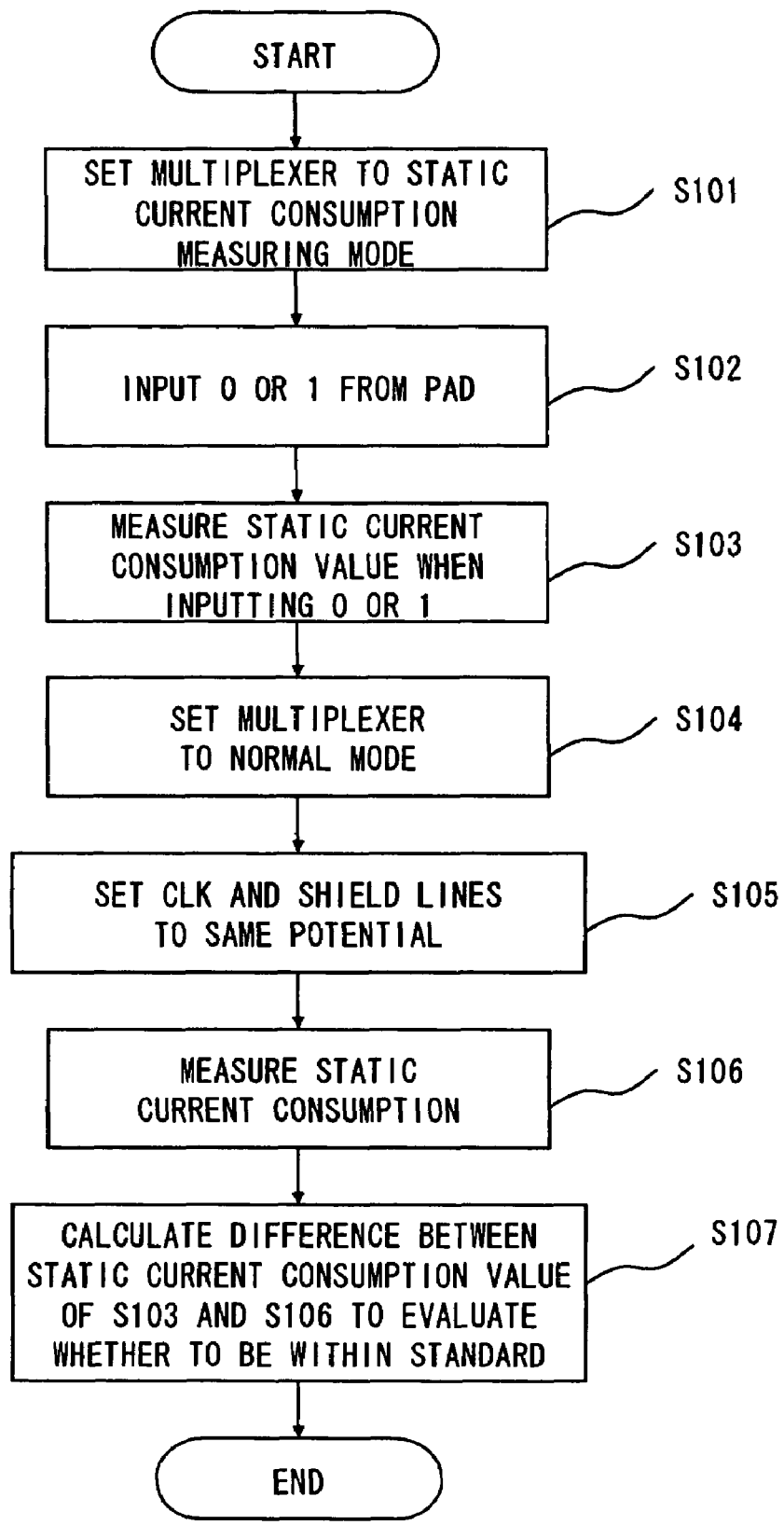
FIG. 3 is a flowchart showing a failure detection method for a semiconductor apparatus according to the present invention.

A failure detection method of this embodiment is described hereinafter in detail with reference to the flowchart of FIG. 3. The failure detection method detects a bridge failure caused by a short-out between the CLK line 11 and the shield line 12 of the semiconductor apparatus 1 in the configuration of FIG. 1.

Firstly a mode setting signal is input from the mode setting terminal to set the multiplexers 5*a* and 5*b* to the failure detection mode (S101) In the failure detection mode, the multiplexers 5*a* and 5*b* select outputs from the inverters 6*a* and 6*b*.

Next, the logical value 0/1 is input to the input/output pad 8 from the logical level generator 21 (S102). Then the shield lines 12 become the input logical value, while the CLK lines 11 become inverted values, which are opposite to the input.

After that the power supply current measuring device 23 measures static current consumption (first static current consumption) in the condition where the values inverted to each other is input to the CLK lines 11 and the shield lines 12 (S103) Then the mode setting signal is input from the mode setting terminal 9 to set the multiplexers 5*a* and 5*b* to the normal operation mode (S104). In the normal operation mode, the multiplexers 5*a* and 5*b* select outputs from the buffers 42*a* and 42*b*.

Then the CLK lines 11 and shield lines 12 are set to the same potential (S105). A signal of the same level as the CLK line 11 is input to the input/output pad 8 from the logical level generator 21.

Then the power supply current measuring device 23 measures static current consumption (second static current consumption) in a condition where the CLK lines 11 are the same potential as the shield lines 12 (S106).

Then the difference between the static current consumption value in the failure detection mode in S103 and the operational static current consumption value in the normal operation mode in S106 is calculated and evaluated whether the difference is within the standard (S107). The evaluation is performed by the power supply current measuring device 23, for example.

Figure 4:
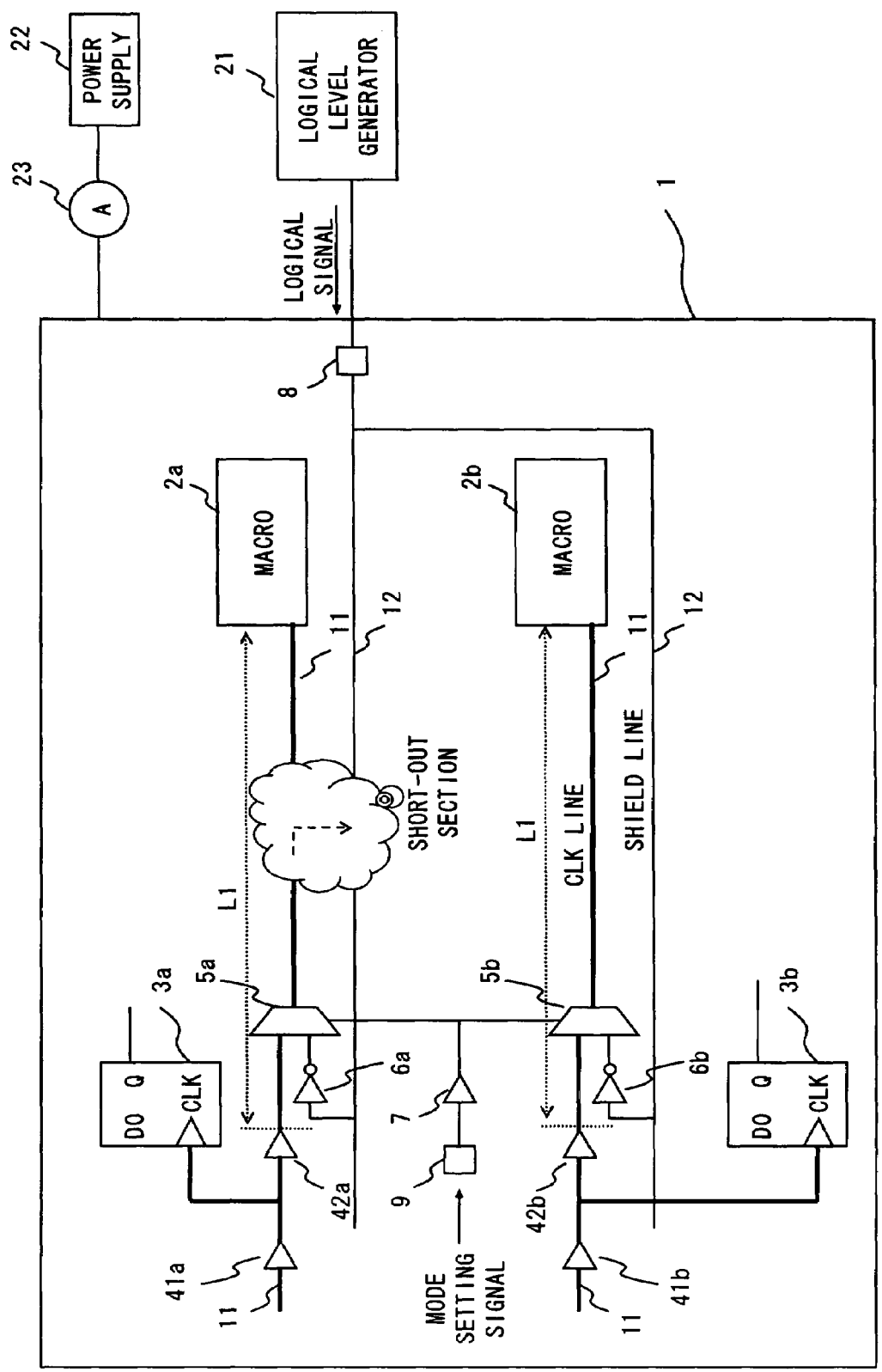
FIG. 4 is a view showing a condition where a bridge failure is occurred in the semiconductor apparatus according to the present invention.
Figure 5:
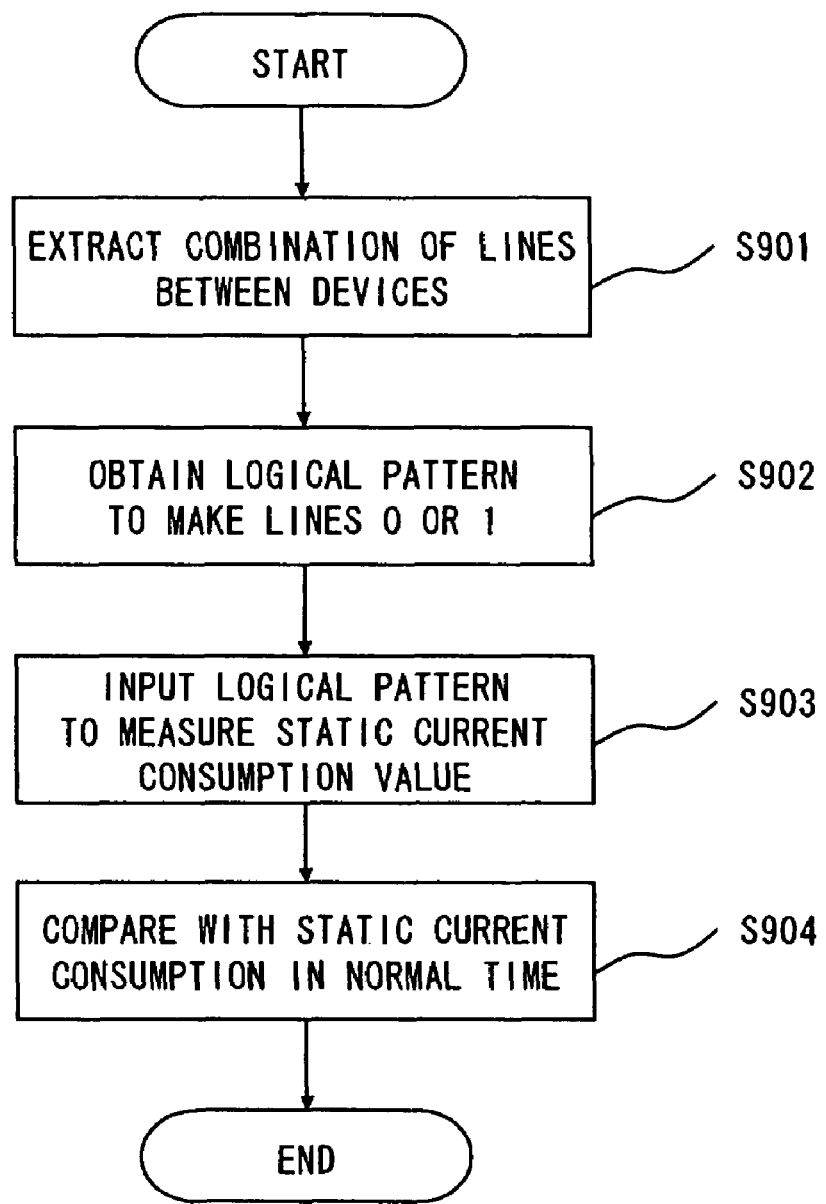
FIG. 5 is a flowchart showing a conventional failure detection method.

For example, if a bridge failure is not occurred in the CLK lines 11, the potential does not fluctuate even if the values of the CLK lines 11 and the shield lines 12 are made to be inverted, thus the static current consumption in the failure detection mode becomes almost the same as in the normal operation mode. If a bridge failure is occurred in the CLK lines 11, a current flows from the CLK lines 11 to the shield lines 12 (or to the opposite direction) in the section where a short-out is occurred, by making the values of the CLK lines 11 and the shield lines 12 inverted as shown in FIG. 4. Thus the static current consumption in the failure detection mode is larger than in the normal operation mode. Accordingly in S107, if the difference of the static current consumptions is larger than the standard, it is evaluated that a bridge failure is occurred.

As described in the foregoing, in this embodiment, a bridge failure can easily be detected by connecting the shield and CLK lines via inverters and inputting inverted data to the CLK lines, without using a conventional logical pattern.

Furthermore, by the multiplexers switching signals in the sections to be detected, it is possible to compare the static current consumption before and after the switch to detect a failure. Accordingly as in a conventional technique, it is not necessary to confirm the static current consumption for a normal semiconductor apparatus, and a failure can be detected only by one semiconductor apparatus.

Furthermore, in the normal operation, by setting the logical value 0/1 from the input/output pad, it is possible to play a role as a shield line.

As described above, a preferred embodiment of the present invention provides a failure detection apparatus and a failure detection method for a semiconductor apparatus that are able to accurately detect a bridge failure in a clock line.

It is apparent that the present invention is not limited to the above embodiment and it may be modified and changed without departing from the scope and spirit of the invention.

What is claimed is:

1. A failure detection apparatus for a semiconductor apparatus comprising:
    a clock line to transmit a clock signal;
    a shield line to shield the clock line;
    an inverted signal setting unit to supply signals inverted to each other to the clock and shield lines in a failure detection mode; and
    a failure detection evaluator to detect a failure by comparing static current consumption in each of the failure detection mode and a normal operation mode.

2. The failure detection apparatus for the semiconductor apparatus according to claim 1, wherein
    the inverted signal setting unit supplies an inverted signal to the clock line, the inverted signal is an inverted reference signal input from an external terminal of the semiconductor to the shield line.

3. The failure detection apparatus for the semiconductor apparatus according to claim 2, further comprising:
    a signal selector to select the inverted or the clock signal to supply to the clock line.

4. The failure detection apparatus for the semiconductor apparatus according to claim 2, wherein
    the static current consumption in the failure detection mode is a static current consumption in which a signal of a logical level 0 and 1 or 1 and 0 is supplied to each of the clock and the shield line.

5. The failure detection apparatus for the semiconductor apparatus according to claim 2, wherein
    the static current consumption in the normal operation mode is a static current consumption in which the clock and the shield lines are at a same potential.

6. The failure detection apparatus for the semiconductor apparatus according to claim 3, wherein
    the clock line is connected to a macro block via a plurality of flip-flops, and
    the signal selector selects the inverted or the clock signal in a position closer to the macro block than the flip-flops that are closest to the macro block.

7. The failure detection apparatus for the semiconductor apparatus according to claim 3, wherein
    the static current consumption in the failure detection mode is a static current consumption in which a signal of a logical level 0 and 1 or 1 and 0 is supplied to each of the clock and the shield line.

8. The failure detection apparatus for the semiconductor apparatus according to claim 3, wherein
    the static current consumption in the normal operation mode is a static current consumption in which the clock and the shield lines are at a same potential.

9. The failure detection apparatus for the semiconductor apparatus according to claim 6, wherein
    the static current consumption in the failure detection mode is a static current consumption in which a signal of a logical level 0 and 1 or 1 and 0 is supplied to each of the clock and the shield line.

10. The failure detection apparatus for the semiconductor apparatus according to claim 6, wherein
    the static current consumption in the normal operation mode is a static current consumption in which the clock and the shield lines are at a same potential.

11. The failure detection apparatus for the semiconductor apparatus according to claim 1, wherein the static current consumption in the failure detection mode is a static current consumption in which a signal of a logical level 0 and 1 or 1 and 0 is supplied to each of the clock and the shield line.

12. The failure detection apparatus for the semiconductor apparatus according to claim 11, wherein the static current consumption in the normal operation mode is a static current consumption in which the clock and the shield lines are at a same potential.

13. The failure detection apparatus for the semiconductor apparatus according to claim 1, wherein the static current consumption in the normal operation mode is a static current consumption in which the clock and the shield lines are at a same potential.

14. A method for failure detection for a semiconductor apparatus comprising:

supplying signals inverted to each other to a clock line that passes a clock signal and a shield line that shields the clock line in a failure detection mode; and detecting a failure by comparing static current consumptions in each of the failure detection and a normal operation modes.

* * * * *